United States Patent [19]

Doany et al.

[11] Patent Number: 5,796,509
[45] Date of Patent: Aug. 18, 1998

[54] THIN FILM FRONTLIGHTING AND BACKLIGHTING FOR SPATIAL LIGHT MODULATORS

[75] Inventors: Fuad Elias Doany, Katonah, N.Y.; Ronald Roy Troutman, Ridgefield, Conn.

[73] Assignee: International Business Machines Corporation, Armonk, N.Y.

[21] Appl. No.: 700,912

[22] Filed: Aug. 21, 1996

[51] Int. Cl.⁶ .................................................. G02F 1/03
[52] U.S. Cl. ............................... 359/254; 359/57; 359/58
[58] Field of Search ................................ 359/254, 57, 58

[56] References Cited

U.S. PATENT DOCUMENTS

| | | | |
|---|---|---|---|
| 4,884,875 | 12/1989 | Okumura | 350/342 |
| 5,386,306 | 1/1995 | Gunjima et al. | 359/352 |
| 5,510,915 | 4/1996 | Ge et al. | 359/59 |

*Primary Examiner*—David C. Nelms
*Assistant Examiner*—Reginald A. Ratliff
*Attorney, Agent, or Firm*—Scully, Scott, Murphy & Presser

[57] ABSTRACT

A thin film light used in displays is disclosed. The thin film light is an organic light generating thin film located between two electrodes. One electrode facing the display is transparent, while another electrode is a reflective patterned electrode. The patterned electrode is aligned with pixel displays. At least one polarizer is used to provide a light or dark display background. The thin film light may be a backlight for transmission displays. Alternatively, the thin film light may be a frontlight for reflective displays, where display illumination and imaging are performed over the same front side of the reflective display.

21 Claims, 7 Drawing Sheets

THIN FILM FRONTLIGHTING AND BACKLIGHTING FOR SPATIAL LIGHT MODULATORS

BACKGROUND OF THE INVENTION

1. Field of the Invention

The present invention is directed to an illumination source for spatial light modulators used in liquid crystal displays, and more particularly, to a compact semi-transparent illumination system for frontlighting of miniature reflective liquid crystal displays, or for backlighting of directly viewed transmission liquid crystal displays.

2. Discussion of the Prior Art

Miniature head mounted displays typically use conventional liquid crystal flat panel displays that operate in transmission. In transmissive displays, a light source is located at the back side of the display, often referred to as a backlighting source. Light from the backlighting source illuminates the transmissive display, where the back light passes through the display and is collected on the display's front side for observation by a viewer.

Typically, backlight sources of transmissive displays are neither transparent nor compact. Often, the backlight source is a fluorescent light tube, in combination with a reflector, light guide and diffuser. The diffuser evenly distributes the backlight toward the display's front side. Other backlight illumination sources are based on more complex optical systems that use conventional solid-state red, green and blue light emitting diodes (LEDs).

Both the fluorescent and LED based illumination systems are adequate for backlighting of transmissive-based displays. However, these conventional illumination systems are not semi-transparent and thus, cannot be used for reflection-based displays. Reflective displays are completely opaque and cannot be "backlit". Therefore, reflective displays require a frontlighting source. The frontlights must be semi-transparent, to allow viewing the reflective displays from the front side. Typical frontlight illumination sources are opaque. Frontlights must be semi-transparent not only to allow display illumination, but also to allow imaging from the same front side of the reflective display. In contrast, transmissive displays are illuminated from the back, while images are formed on the display front.

As a result of the simultaneous imaging and illuminating at the front of reflective displays, complex and inefficient bulky optical systems are needed. For example, beam splitting and imaging optics must be used that have two different optical paths; one path for illumination, and another path for viewing the reflective display. This prevents miniaturization of reflective displays and increases cost.

SUMMARY OF THE INVENTION

The object of the present invention is to provide a display illumination source that eliminates the problems of conventional light sources.

Another object of the present invention is to provide a thin illumination system that can be used either as a frontlight source for reflective displays or as a backlight source for transmissive displays.

Yet another object of the present invention is to provide compact, simple and inexpensive illumination sources for displays.

The present invention accomplishes these and other objects by a display having a spatial light modulator (SLM) and an illumination system. The SLM includes liquid crystal sandwiched between a pair of SLM electrodes. The illumination system comprises a pair of electrodes including a substantially transparent electrode and an opposing patterned reflective electrode. A light generating thin film is located between the pair of electrodes to generate light in response to an electrical signal applied across the electrodes. The generated light passes through the substantially transparent electrode to illuminate the display, and reflects from the patterned reflective electrode toward the display.

The illumination system may be an integral part of the SLM. This eliminates the need for an SLM substrate located between the SLM and the illumination source. The SLM and the illumination system may also share an electrode.

The patterned electrode is aligned over pixels of the display, which may be a reflective or transmissive display. For a reflective display, the thin film light is a frontlight. For a transmissive display, the thin film light is a backlight. The light generating film is an organic light emitting diode.

One or two polarizers may be included in the thin film light, which may be patterned or unpatterned. In addition, a quarter wave retarder may be included. Depending on the arrangement of the polarizer(s) and retarder, the display may be normally black or normally white, in the absence of a pixel signal applied to the SLM electrodes.

The SLM may have a color filter array. Instead of the color filter array, the light generating thin film of the illumination system may have adjacent alternating red, green and blue films aligned to the patterned electrode.

The inventive illumination system is compact, thin and efficient. It provides proper backlight or frontlight illumination and may be used with miniature displays, such as head-mounted displays or displays of portable computers, electronic notebooks and organizers, personal communicators, etc.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical numerals throughout the drawings; and in which.

DETAILED DESCRIPTION OF THE INVENTION

A thin film light source according to the present invention is efficient and uses organic light emitting diodes (OLEDS)

for use as an illumination source for spatial light modulators (SLMs), such as liquid crystal displays. The light generation is based on injection luminescence from organic films placed between two electrodes. One electrode is substantially transparent, such as a layer of indium tin oxide (ITO). The other electrode need not be transparent and may be a thin metal layer such as aluminum (Al) or silver (Ag) \magnesium (Mg).

Figure 1:
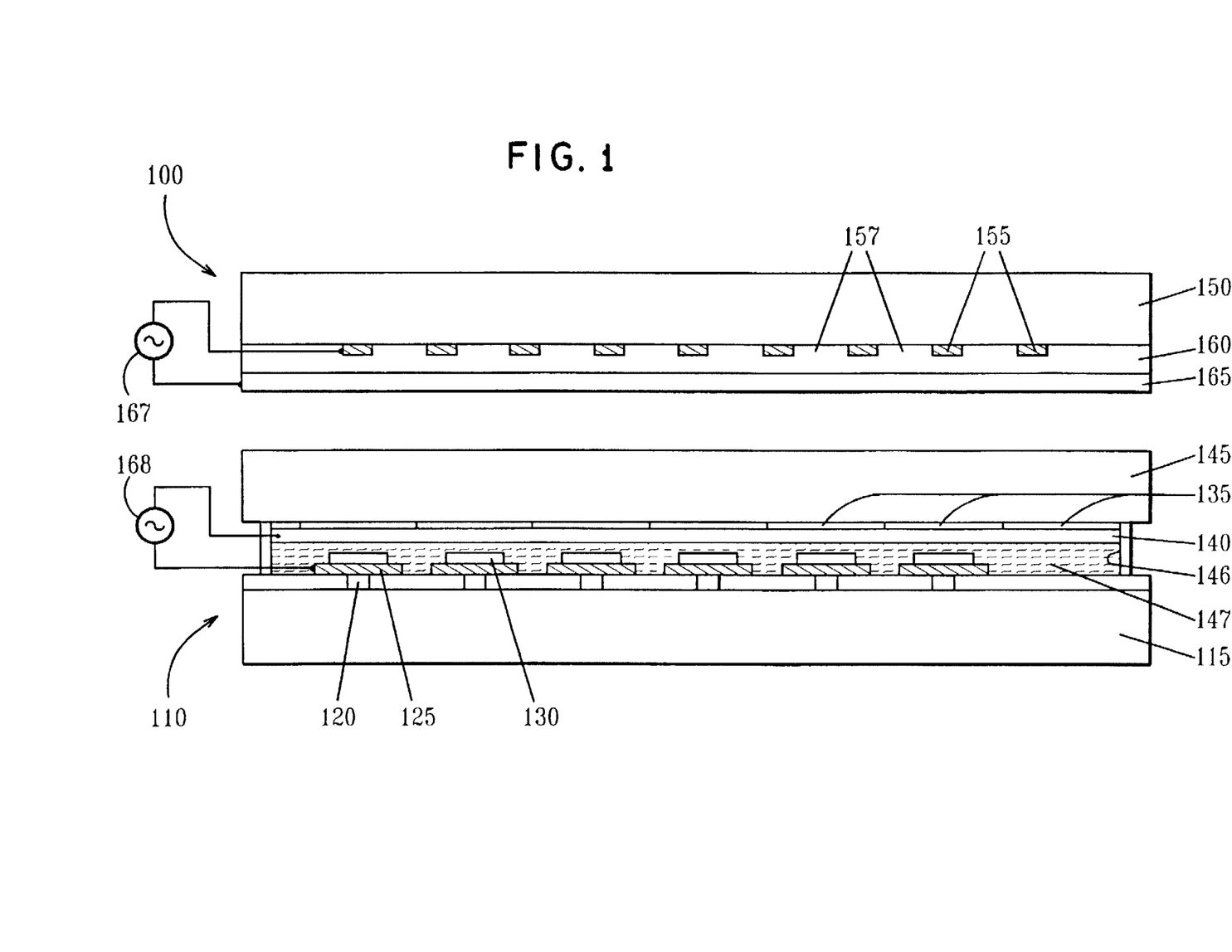
FIG. 1 shows a cross-section of a white light front illumination system of a reflective display according to the present invention.

FIG. 1 shows a cross section of a frontlight illumination system 100 of a reflective spatial light modulator (SLM) 110 used in reflective displays, such as liquid crystal displays. The illumination system 100 is a thin film frontlight which may be fabricated separately from the reflective SLM 110. In this case, the frontlight 100 is aligned to the SLM 110 during final assembly.

As shown in FIG. 1, the reflective SLM 110 comprises a substrate 115. Devices necessary for SLM operation are formed on the substrate 115. For example, integrated circuits, such as field effect transistors (FETs) or thin film transistors (TFTs) 120, are formed on the substrate 115 to drive counter-electrodes 125. This substrate 115 may be based on crystalline silicon (c-Si), polycrystalline silicon (p-Si), or amorphous silicon (a-Si) technology. Mirrors 130 are formed over the counter-electrodes 125. The FETs or TFTs 120, counter-electrodes 125, and mirrors 130 are arranged in an array to form an array of pixels.

An array of color filters 135 is formed on a second substrate 145. The color filter array 135 is aligned with the image pixels, i.e. with the counter-electrode array 125. If needed, a thin layer of indium tin oxide (ITO) 140 is formed on the color filters 135. The ITO layer 140 is a transparent front electrode of the SLM 110. The second substrate 145 is attached to the substrate 115 using spacers to form a gap 146 between the substrate 115 and the ITO electrode 140 formed on the color filter array 135 and second substrate 145. The gap 146 is filled with a liquid crystal (LC) 147. The second substrate 145 is referred to as a top glass cover plate 145 of the SLM 110. Illustratively, for the frontlighting of reflective liquid crystal cells, the liquid crystal is a polarization based twisted nematic liquid crystal (TNLC) or a scattering based polymer dispersed liquid crystal (PDLC). For backlighting of transmission liquid crystal cells, the liquid crystal may be a TNLC.

The thin film frontlight structure 100 is fabricated on a glass substrate 150 by forming a metal cathode, such as depositing an aluminum (Al) layer 155 on the glass substrate 150. The Al layer 155 is patterned to allow light reflected from individual pixels/counter-electrodes 125 to pass through voids 157 between the patterned Al layer 155. An organic light emitting diode (OLED) film 160 is formed on the patterned Al layer or electrodes 155. The OLED film 160 may be formed by thermal evaporation. More than one OLED film may be formed over each other or adjacent to each other. The OLED layer 160 provides luminescence to illuminate the SLM 110 and the patterned Al layer 155. The patterned Al layer 155 serves as a mirror to reflect light toward the SLM 110. Depending on the type of organic film or films, the light output may be white, or red, or blue, or green light. Next a layer of a substantially transparent electrode, such as an ITO layer 165 is formed on the OLED film 160. The ITO electrode 165 may be shared between the illumination system 100 and the SLM 110. This eliminates the need for the SLM ITO electrode 140.

A signal source 167 is connected to apply an electrical signal between the metal and transparent electrodes 155, 165. The electrical signal, such as a DC or AC voltage, produces light from the luminescent organic polymer film (or films) 160. Light emitted from the organic layer 160 and directed to the transparent electrode 165 emerges from the thin film stack 160. Light directed toward the non-transparent patterned metal electrode 155 will be reflected by the metal and traverse the full thin film stack 160 to emerge from the transparent electrode 165 toward the SLM 110.

Another signal source 168 is connected to apply a DC or AC signal across the SLM counter-electrode 125 and the SLM ITO electrode 140. In the absence of a separate SLM ITO electrode 140, the signal source 168 is connected between the SLM counter-electrode 125 and the ITO electrode 165 common to both the illumination source 100 and the SLM 110. Because the illumination system 100 uses a thin OLED film, low voltage operation and low power consumption are achieved. Illustratively, the operating voltage is between 5 volts and 12 volts, and power consumption is approximately 0.25 watts.

The light source 100 can be used to illuminate both reflective and transmissive displays. In transmission, the thin film OLED light source 100 can replace a conventional lamp-based backlight source, such as those used in conventional flat panel liquid crystal displays. However, the preferred embodiment is a frontlight for reflective liquid crystal light valves, particularly miniature reflective displays for head mounted applications.

Semi-transparency in the thin film OLED illuminator 100 is achieved by selective patterning of the metal electrode 155. For example, the aluminum electrode 155 can be patterned to form an electrically continuous line, grid, or array structure. The relative area of the remaining voids 157 to the total surface area defines the aperture ratio, or degree of transparency. If only 10% of the area is aluminum and the remaining area is voids 157, then an aperture ratio of 90% is achieved. Thus the aperture ratio can be varied from a few percent to greater than 90%.

Figure 2:
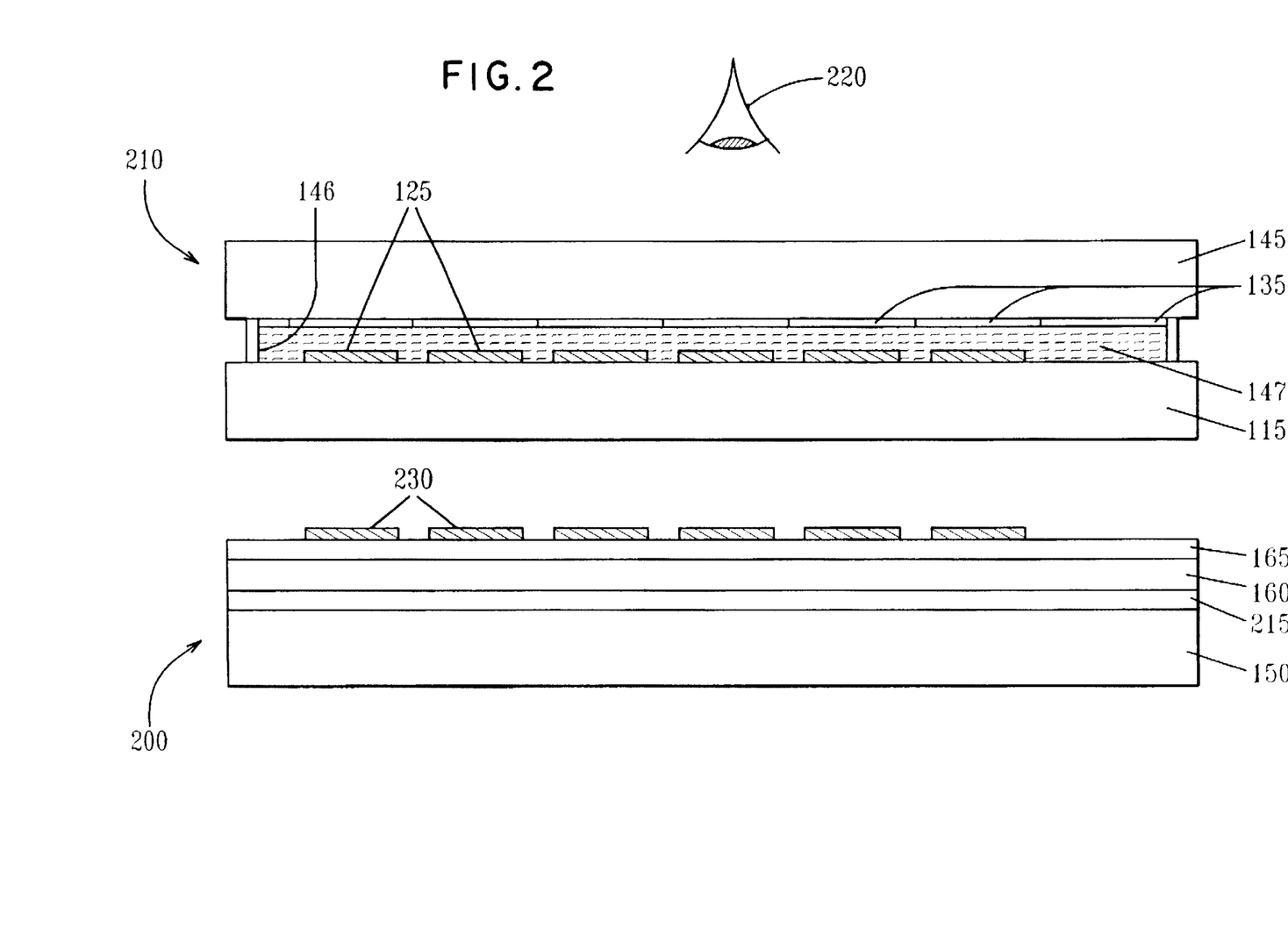
FIG. 2 shows a cross-section of a white light front illumination system of a transmissive display according to the present invention.

FIG. 2 shows the thin film illumination source 100 used as a backlight 200 for a transmissive SLM 210. This is similar to the structure of FIG. 1 except the illumination source 200 is located behind the SLM 210. The SLM 210 is transmissive, and its counter-electrodes 125 may be semi-transparent. Furthermore, instead of having a patterned electrode 155, the backlight illumination source 200 may have a metal sheet electrode 215. The transmissive SLM 210 is located between the backlight 200 and a viewer 220. Light from the OLED 160 travels through the SLM 210 toward the viewer 220.

For higher backlighting efficiency, the organic electroluminescent film(s) 160 and/or the electrode 215, can be patterned such that the light emitting regions coincide with the display pixels. In this case, the backlighting source is aligned to the pixel structure.

Due to proximity effects, a microlens array 230, also corresponding to the display pixel structure, may be used to ensure that light intended for a specific pixel is directed to that pixel. The microlens array 230 is located between the light source 200 and transmissive SLM 210. Illustratively, the microlens array 230 is formed over the ITO electrode 165 of the backlight 200. For the case of white light emitting organic electroluminescent films 160, this ensures higher backlighting efficiencies. For the case of color emitting polymers 410 to be discussed in connection with FIG. 7, the pixel aligned microlens 230 ensures that each specific color emitting region is directed only to the corresponding display pixel.

Returning to FIG. 1, polarizers may be formed on one or both sides of the thin film frontlight 100. A first polarizer P1 may be formed on the ITO layer 165. In another embodiment, polarizer P1 is patterned and a second polarizer P2 is formed on the backside of the glass substrate 150 when a "normally white" mode operation is desired. Each pixel of an image may be associated with an individual patterned OLED electrode 155, polarizer P1, mirror 130, counter-electrode 125 and TFT 120. An array of these pixel associated elements forms a display onto which the array of pixels forms an image.

Figure 3:
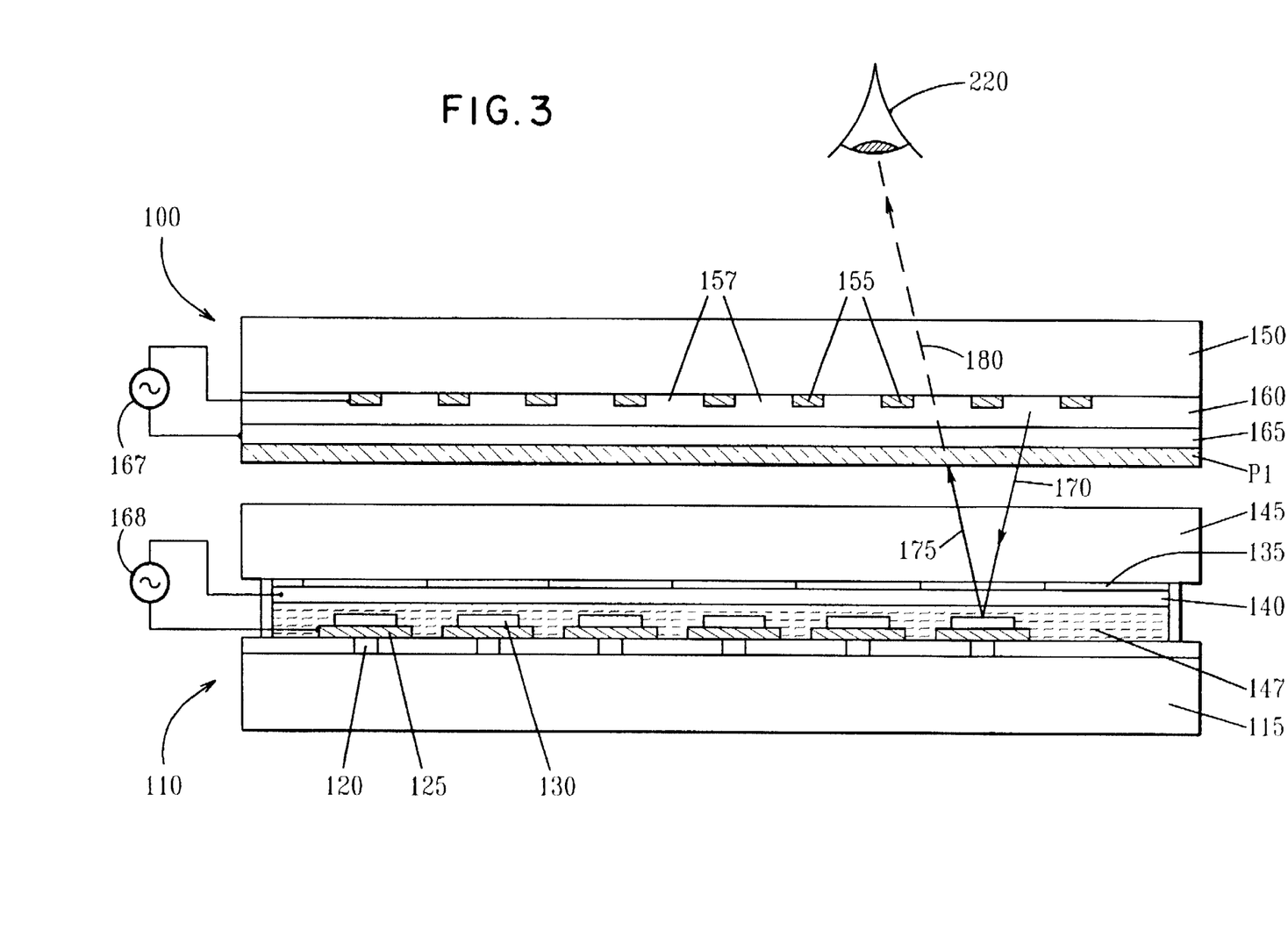
FIG. 3 shows the illumination system of FIG. 1 configured in a "normally black" mode according to the present invention.

FIG. 3 shows the illumination system 100 having an unpatterned first polarizer P1 on the ITO layer 165. White light generated by the organic film 160, between the ITO 165 and the patterned metal cathode 155, is polarized upon passing through polarizer P1. Thus, only linearly polarized light 170 illuminates the reflective SLM 110. The linearly polarized light 170 reflects from the mirror 130 of the reflective SLM 110. The reflected light is designated as numeral 175 in FIG. 3. When no signal is applied to a pixel or counter-electrode 125 of the SLM 110 by the signal source 168, the birefringence of the liquid crystal 147 linearly polarizes the reflected light 175 in a direction perpendicular to the polarization of the entering light 170. Thus, the reflected light 175 is blocked by polarizer P1, and the pixel appears dark.

Applying a signal or voltage to the SLM pixels across the counter-electrode 125 and SLM ITO electrode 140 (or the shared ITO electrode 165 in the absence of a separate SLM ITO electrode 140), causes the reflected light 175 to be elliptically polarized. This allows some of the light to pass through polarizer P1 and reach a viewer 220, as shown by dashed lines 180. Applying a large enough voltage causes the reflected light 175 to again be linearly polarized, such that all of the light passes through polarizer P1. In this embodiment, the display is in a "normally black" mode, since the pixel (or display) is black in the absence of a voltage between the ITO electrode 165 (or SLM electrode 140) and counter-electrode 125.

Figure 4:
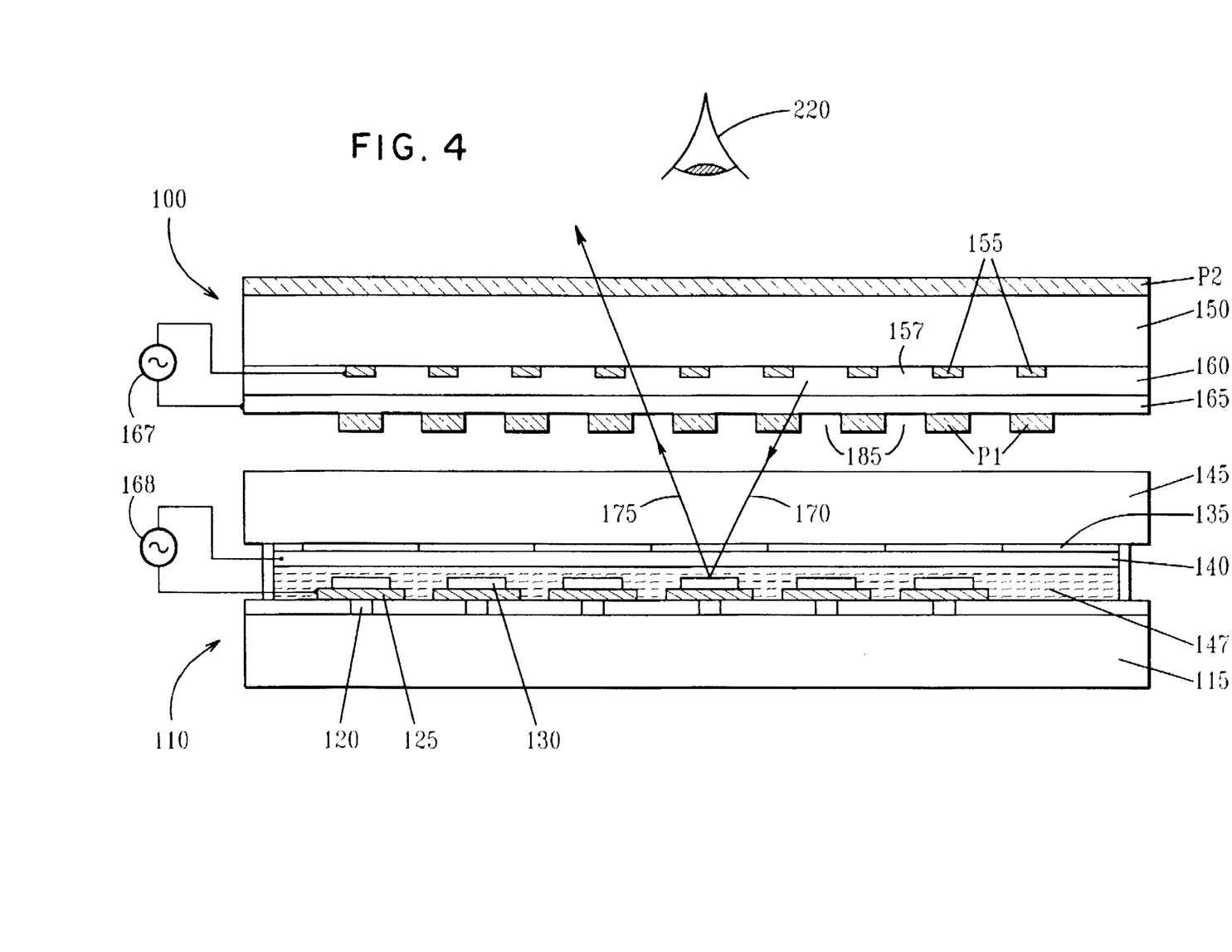
FIG. 4 shows the illumination system of FIG. 1 configured in a "normally white" mode according to the present invention.

FIG. 4 shows an alternate embodiment of the illumination system 100, where a patterned first polarizer P1 is formed on the ITO layer 165 and an unpatterned second polarizer P2 is formed on the backside of the glass substrate 150. The patterned first polarized P1 is separated by voids 185 and linearly polarizes light 170 that enters the SLM 110. With no voltage applied to the SLM pixel counter-electrode 125, the reflected light 175, which has been rotated 90° by the reflection, passes through the area 185 from which polarizer P1 has been removed. In this alternative version, the unpatterned polarizer P2, which is placed on the outer side of the thin film frontlight 110, is oriented so that 90° rotated light passes unimpeded.

When a voltage is applied to the SLM pixels, the reflected light 175 is no longer rotated by 90°. Thus, a portion of the reflected light 175 is blocked by the unpatterned polarizer P2. Applying a large enough voltage completely blocks the reflected light. In this embodiment, the display comprising the frontlight 100 and reflective SLM 110 is in a "normally white" mode.

Figure 5:
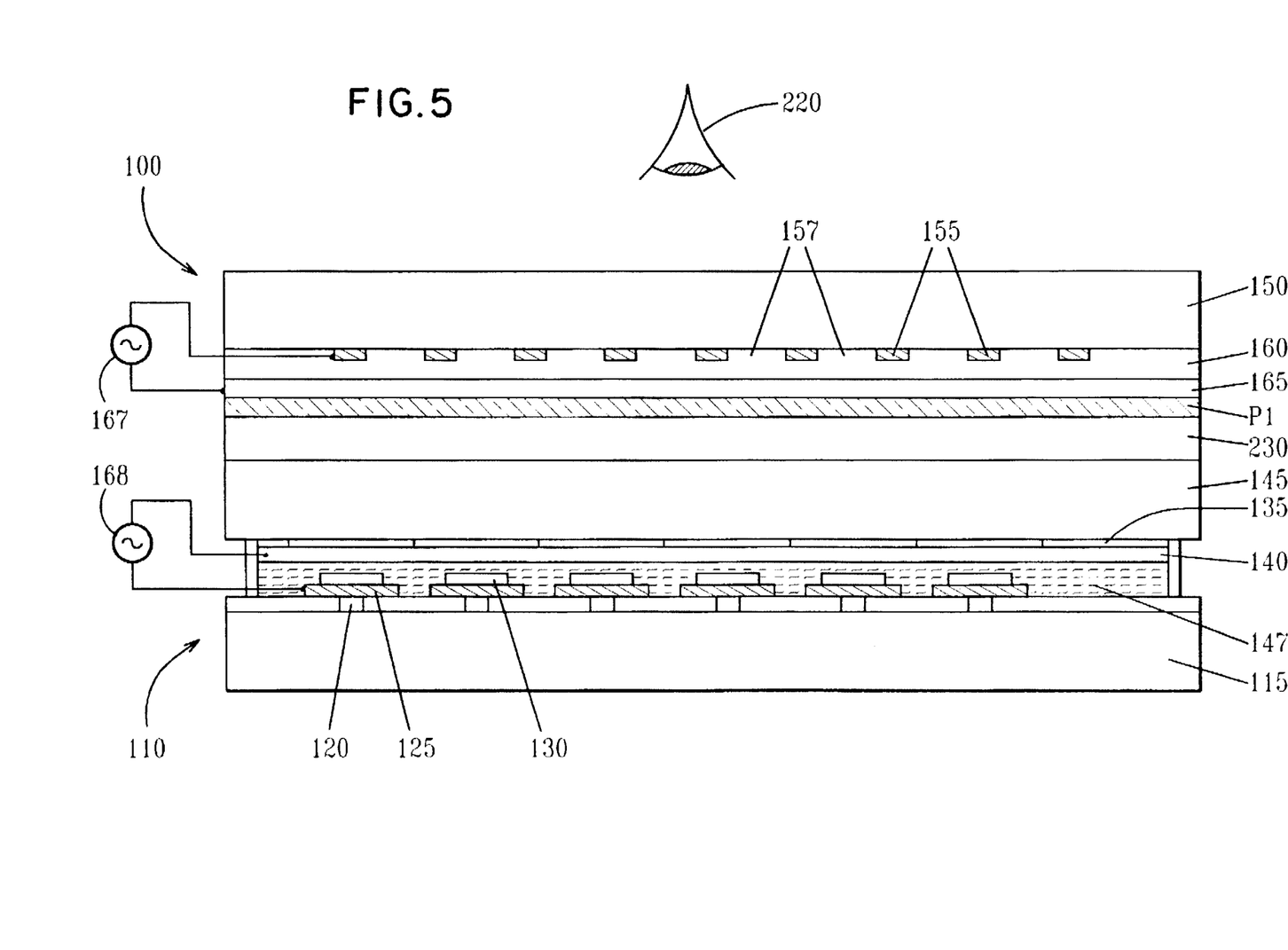
FIG. 5 shows the illumination system of FIG. 3 in a "normally white" mode according to the present invention.

A third embodiment, shown in FIG. 5, is similar to the embodiment shown in FIG. 3, where an unpatterned P1 is used, without a second polarizer P2. However, unlike FIG. 3, this embodiment has a quarter-wave retarder film 230. The quarter-wave retarder film 230 is located between the unpatterned polarizer P1 and the glass cover plate 145 of the reflective SLM 110. The retarder film 230 provides a λ/4 retardation producing circularly polarized light passing therethrough. Consequently, the retarder film 230 rotates light by 90° in double pass. This converts the mode of operation of the embodiment shown in FIG. 3, from "normally black" to "normally white".

Figure 6:
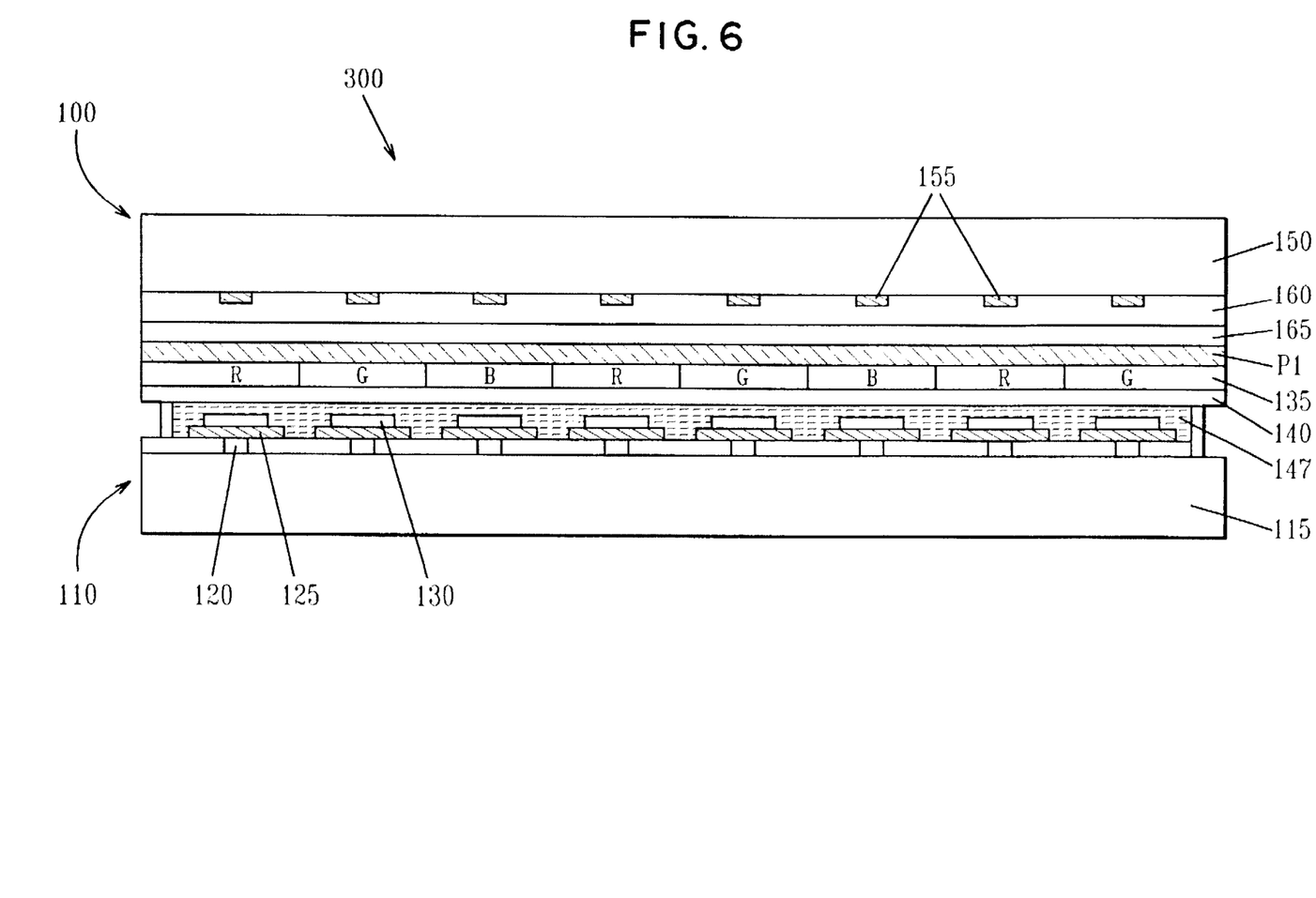
FIG. 6 shows a cross-section of a frontlight integrated with a reflective display according to the present invention.

FIG. 6 shows a cross-section of a reflective display 300 where the frontlight 100 is integrated with the reflective SLM 110. The SLM top glass plate 145, shown in FIGS. 1 and 3–5, is eliminated in the integrated display 300. This provides a lighter and thinner display. In addition, alignment of the front light 100 to the SLM 110 during display assembly is eliminated.

The display 300 comprises the SLM substrate 115, on which TFT drivers 120 are formed. The TFT drivers 120 drive individual counter-electrodes 125 formed on the substrate 115. A mirror or dielectric stack 130 is formed on each counter-electrode 125. A sacrificial layer is formed on the substrate 115, covering the various devices already formed on the substrate 115. The SLM ITO common electrode 140 is formed on the sacrificial layer, which is etched to form a gap between the SLM substrate 115 and SLM ITO electrode 140. The gap is filled with liquid crystals 147. Color filters 135 are formed on the SLM ITO electrode 140.

Instead of an SLM top glass substrate 145, a polarizer layer P1 is formed on the color filters 135. Next, the front light ITO layer 165 is formed, followed by the organic electro-luminescent OLED film 160. A conductive and reflective layer is formed and patterned on the OLED 160. This forms the patterned OLED electrode 155. Next, the top glass substrate 150 is formed on the patterned OLED electrode 155. The integrated display 300 operates in the "normally black" mode as described in connection with FIG. 3.

As described in connection with FIGS. 4–5, "normally white" mode display is formed by using the quarter-wave retarder 230 shown in FIG. 5, or patterning P1 and forming a second unpatterned polarizer P2 shown in FIG. 4. For clarity, the signal source 167, 168 of FIG. 1, 3–5 are omitted from FIG. 6.

In the foregoing embodiments, the OLED 160 is a white OLED frontlight. The white OLED 160, in conjunction with the color filters 135, produces full color images. In another embodiment, shown in FIG. 7, a multi-color frontlight 400 has color dyed OLEDs 410. This eliminates the need for the color filters 135. For clarity, only the frontlight 400 is shown, but it is understood that the reflective SLM 110, along with the signal source 167, 168 shown in the previous FIGs form a display along with the frontlight 400.

Figure 7:
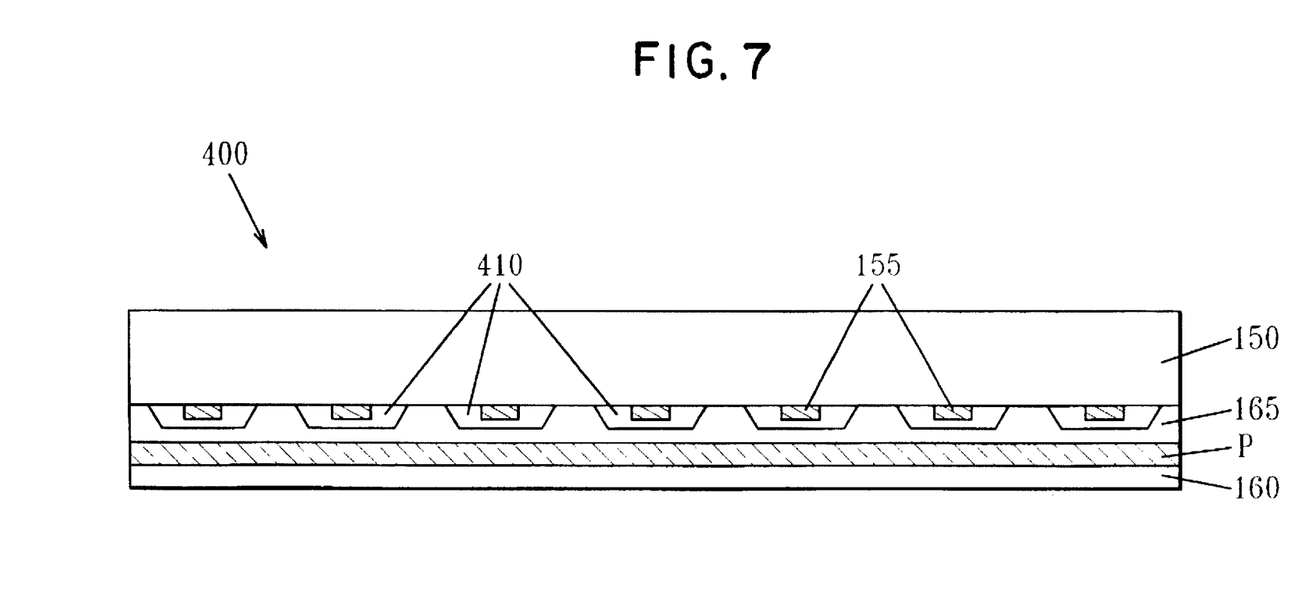
FIG. 7 shows a cross-section of a frontlight having dyed organic light emitting diodes according to the present invention.

The color dyed OLEDs 410 are sequentially doped with fluorescent dyes so that the portion of the frontlight over each sub-pixel of the reflective SLM 110 emits different colors, for example, either red, green or blue light. This results in alternating adjacent red, green and blue light sources 410. The sub-pixel under the red emitter modulates the amount of red light that is reflected from the SLM. The same is true for green and blue emitters so that the full color range is produced from the color pixel comprising red, green and blue sub-pixels.

The adjacent alternating OLEDs 410 surround the patterned electrode 155, which is formed over the substrate 155. The ITO electrode 165 is formed over the OLEDs 410 and exposed portions of the substrate 150. A polarizer P is formed over the ITO electrode 165. If needed for operation of the SLM LC cell, a second ITO electrode 160 may be formed over the polarizer P.

This multi-color frontlight 400 may be fabricated as a stand-alone frontlight similar to that shown in FIG. 1, Polarizers and a quarter wave retarder may be included to form normally white or normally black displays as described in connection with FIGS. 3–5. Alternatively, the multi-color frontlight 400 may be integrated with the reflective SLM in a manner similar to that shown in FIG. 6. The multi-color frontlight 400 can be operated with an unpatterned polarizer P1 and no polarizer P2 ("normally black") or with a patterned P1 polarizer and a P2 polarizer ("normally white") as discussed in connection with FIGS. 3–5.

Any of the thin film frontlights discussed above can be used with other types of liquid crystal displays, such as polymer-dispersed liquid crystal (PDLC) and polymer stabilized cholesteric texture (PSCT). In these displays no polarizer is needed. Light shining on a pixel is either largely back-scattered or remains largely unscattered in passing through the liquid crystal to the backside, where it is either reflected or absorbed, depending on the display design being reflective or transmissive.

The inventive illumination system is compact, thin and efficient, consuming little power yet providing proper illumination. The illumination system may be used as frontlight and backlight for reflective and transmissive displays, respectively. The compact, thin and low voltage/low power consumption characteristics allow use of the inventive illumination system with miniature displays, such as head-mounted displays or displays of portable computers, electronic notebooks and organizers, personal communicators, and other devices having displays.

While the invention has been particularly shown and described with respect to illustrative and preformed embodiments thereof, it will be understood by those skilled in the art that the foregoing and other changes in form and details may be made therein without departing from the spirit and scope of the invention which should be linked only by the scope of the appended claims.

Having thus described our invention, what we claim as new, and desire to secure by letter patent is:

1. A thin film light comprising:
   a pair of electrodes including a substantially transparent electrode and an opposing patterned reflective electrode; and
   a light generating thin film located between said pair of electrodes, wherein said light generating thin film generates light in response to an electrical signal applied across said pair of electrodes;
   said light passing through said substantially transparent electrode to illuminate a display, and reflecting from said patterned reflective electrode toward said display.

2. The thin film light of claim 1, wherein said display is a reflective display which reflects said light to pass through opening located between said patterned reflective electrode, and said thin film light is a frontlight of said reflective display.

3. The thin film light of claim 1, wherein said display is a transmissive display transmitting said light to a viewer, and said thin film light is a backlight of said transmissive display.

4. The thin film light of claim 1, wherein said light generating thin film is an organic light emitting diode.

5. The thin film light of claim 1, wherein said patterned electrode is aligned over pixels of said display.

6. The thin film light of claim 1 further comprising a polarizer located between said substantially transparent electrode and said display, wherein said polarizer blocks light reflected from said display in absence of a pixel signal applied to said display so that said display is in a normally black mode.

7. The thin film light of claim 1, further comprising:
   a polarizer located between said substantially transparent electrode and said display; and
   a quarter-wave retarder film located between said polarizer and said display, wherein light reflected from said display passes through said polarizer in absence of a pixel signal applied to said display so that said display is in a normally white mode.

8. The thin film light of claim 1, further comprising:
   a patterned polarizer located between said substantially transparent electrode and said display; and
   an unpatterned polarizer located over said patterned reflective electrode,
   wherein, in absence of a pixel signal applied to said display, light reflected from said display passes through voids between said patterned polarizer and through said unpatterned polarizer, so that said display is in a normally white mode.

9. The thin film light of claim 8, wherein said patterned polarizer is aligned with pixels of said display.

10. The thin film light of claim 1, wherein said light generating thin film comprises a plurality of adjacent alternating films of different color aligned to said patterned reflective electrode.

11. The thin film light of claim 10, wherein said alternating films of different color are alternating red, green and blue films.

12. A display comprising:
   a spatial light modulator which comprises:
      an array of patterned counter-electrodes formed on a first substrate having an array of drivers associated with said counter-electrode array;
      liquid crystals located over said patterned counter-electrode array; and
      an array of color filters aligned over said counter-electrode array;
   a thin film light source; and
   a second substrate covering said light source;
   said thin film light source comprising:
      a polarizer located over said color filter array;
      a semi-transparent electrode located over said polarizer;
      a light generating thin film located over said semi-transparent electrode; and
      an array of patterned electrodes located over said thin film, said patterned electrode array being aligned to said patterned counter-electrodes;
   wherein said light generating thin film generates light in response to a signal applied to said patterned electrode array, said light passing through said semi-transparent electrode and illuminating said liquid crystals.

13. The display of claim 12, wherein said light source is an integral part of said spatial modulator.

14. The display of claim 12, further comprising a third substrate separating said polarizer from said color filter array, wherein said spatial light modulator and said thin film are formed separately and aligned over each other during assembly of said display.

15. The display of claim 12, wherein said polarizer blocks light reflected from said display in absence of a pixel signal applied to said display so that said display is in a normally black mode.

16. The display of claim 12, further comprising:
   a polarizer located between said substantially transparent electrode and said display; and a quarter-wave retarder film located between said polarizer and said display, wherein light reflected from said display passes through said polarizer in absence of a pixel signal applied to said display so that said display is in a normally white mode.

17. The display of claim 12, further comprising:

a patterned polarizer located between said substantially transparent electrode and said display;

and an unpatterned polarizer located over said patterned reflective electrode, wherein, in absence of a pixel signal applied to said display, light reflected from said display passes through voids between said patterned polarizer and through said unpatterned polarizer, so that said display is in a normally white mode.

18. The display of claim 12, wherein said patterned polarizer is aligned with pixels of said display.

19. The display of claim 12, wherein said light generating thin film is an organic light emitting diode.

20. The display of claim 12, wherein said patterned electrode is aligned over pixels of said display.

21. The thin film light of claim 1 further comprising a polarizer located between said substantially transparent electrode and said display.

* * * * *